United States Patent
Fossum

[11] Patent Number: 5,995,163
[45] Date of Patent: Nov. 30, 1999

[54] MEDIAN FILTER WITH EMBEDDED ANALOG TO DIGITAL CONVERTER

[75] Inventor: Eric R. Fossum, La Crescenta, Calif.

[73] Assignee: Photobit Corporation, Pasadena, Calif.

[21] Appl. No.: 08/723,897

[22] Filed: Sep. 30, 1996

[51] Int. Cl.[6] .................................................. H03M 1/12
[52] U.S. Cl. .......................................... 348/572; 348/571
[58] Field of Search .................................. 348/448, 458, 348/441, 572, 574, 576, 615, 616, 617, 625, 720, 571

[56] References Cited

U.S. PATENT DOCUMENTS

| | | | |
|---|---|---|---|
| 4,513,440 | 4/1985 | Delman | 382/30 |
| 4,682,230 | 7/1987 | Perlman et al. | 358/167 |
| 4,736,439 | 4/1988 | May | 382/54 |
| 4,868,773 | 9/1989 | Coyle et al. | 364/724.01 |
| 5,488,421 | 1/1996 | Hwang et al. | 348/448 |

OTHER PUBLICATIONS

Demassieux et al, "VLSI Architecture for a One–Chip Video Median Filter", Proceedings IEEE International Conference on Acoustics, Speech and Signal Processing, vol. 3, pp. 1001–1004 (1985).

*Primary Examiner*—Andrew I. Faile
*Assistant Examiner*—Uyen Le
*Attorney, Agent, or Firm*—Fish & Richardson P.C.

[57] ABSTRACT

A digital median filter is made using a successive approximation A/D converter circuit, which is arranged to produce an output based on majority weighting.

14 Claims, 5 Drawing Sheets

MEDIAN FILTER WITH EMBEDDED ANALOG TO DIGITAL CONVERTER

TECHNICAL FIELD

The present specification describes median filtering in the digital domain. More specifically, techniques of using an analog to digital ("A/D") converter circuit are described which carry out a median filtering operation that produces a digital output.

BACKGROUND AND SUMMARY

Median filtering is a well-known image processing tool which replaces one or many pixels of an image with a median value of a neighborhood of pixels. The median filter has been used for various functions including noise removal. A median filter uses a local neighborhood of pixels, usually a square of n×n pixels. The median value of the neighborhood is the pixel which has x number of pixels brighter than that pixel value and x number of pixels that are less bright than that pixel value. The same number of pixels are hence brighter and less bright than the median.

Median values have been used for certain effects in images. One particularly preferred use for median values is in correction of inoperative pixels in a pixel device, i.e., dead pixels.

Various complicated operations have been used to obtain the median value. One common way of obtaining the median value includes storing all the pixel values of the neighborhood into registers, and subsequently testing the register contents and determining which pixel value is the median among those values. This requires multiple comparisons which dictate the speed of the process.

Many median filtering operations have been digital operations. Median filtering of image hence often necessitated a separate analog to digital conversion step.

The present invention defines a digital median filter. The technique of the present invention simultaneously carries out analog to digital conversion while obtaining a digital median value bit by bit. The system of the present invention allows obtaining varying resolution as a tradeoff for a longer conversion time.

Another aspect of the present invention is a median filter which operates without analog circuit components such as a differential amplifier. Yet another object of the present invention is to describe a combined A/D converter and median filter which carries out both operations in a single step to improve the speed thereof. The operation according to the preferred embodiment is carried out by using a successive approximation A/D technique which is modified to produce an output value indicative of the median value. It is hence another object of the present invention to use a successive approximation type A/D converter in a special way to secure a digital output indicative of a median value.

BRIEF DESCRIPTION OF THE DRAWINGS

These and other aspects will be described with reference to the accompanying drawings in which.

DESCRIPTION OF THE PREFERRED EMBODIMENT

The preferred embodiment receives analog values, and median filters those analog values in a discrete time while simultaneously converting the analog value to a digital word "b". The number of bits of the digital word, and hence the resolution, is successively updated during subsequent "investigation" cycles.

The preferred circuit does not require the integration of analog circuit components (e.g., differential amplifiers) as part of the converting circuit. The resultant system may operate with lower power than would be used by the separate components, and may also be faster than separate sequential median filtering and A/D converter stages.

Figure 1:
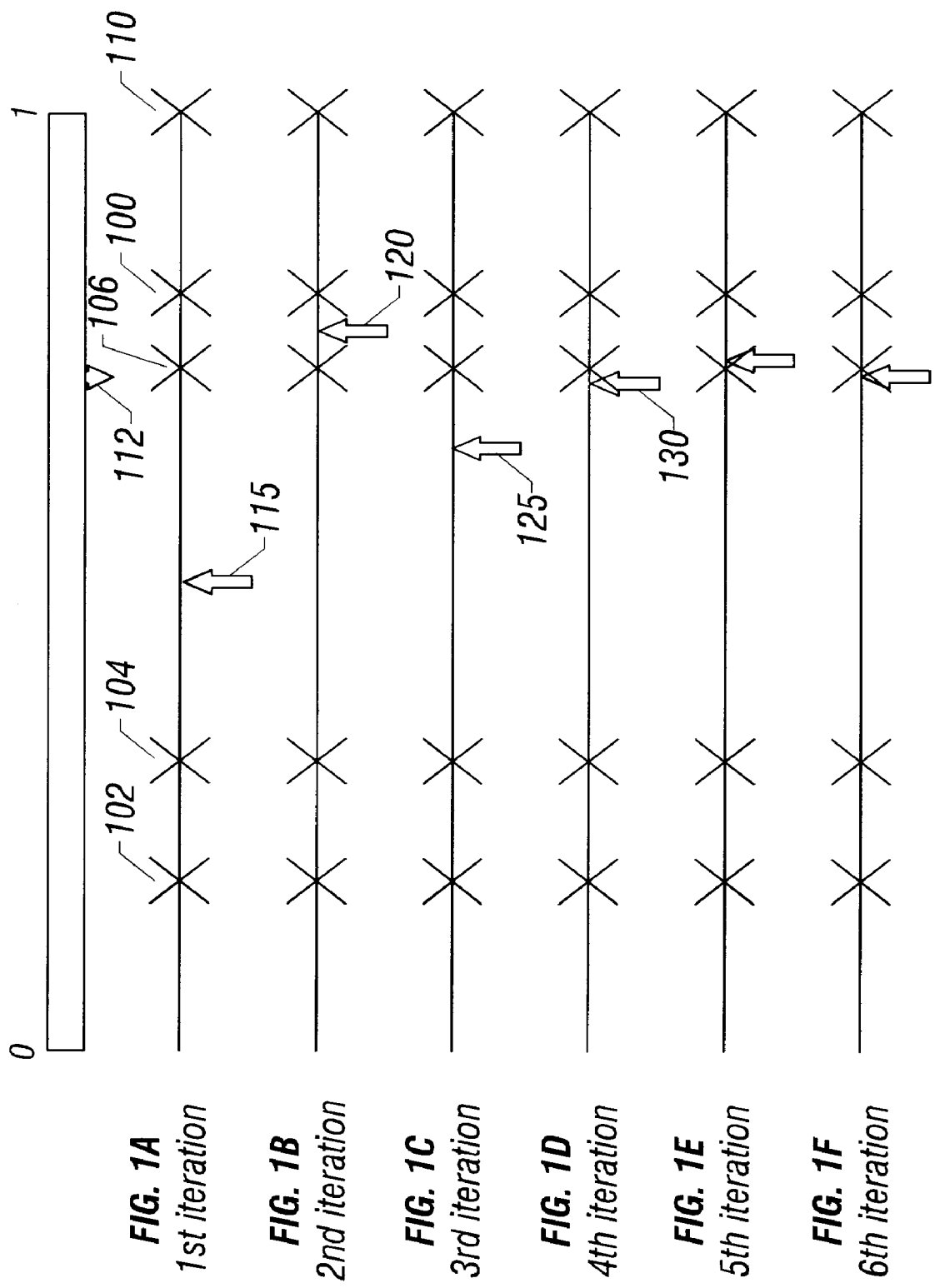
FIG. 1 illustrates the median filtering technique that is used according to the present invention.
Figure 2:
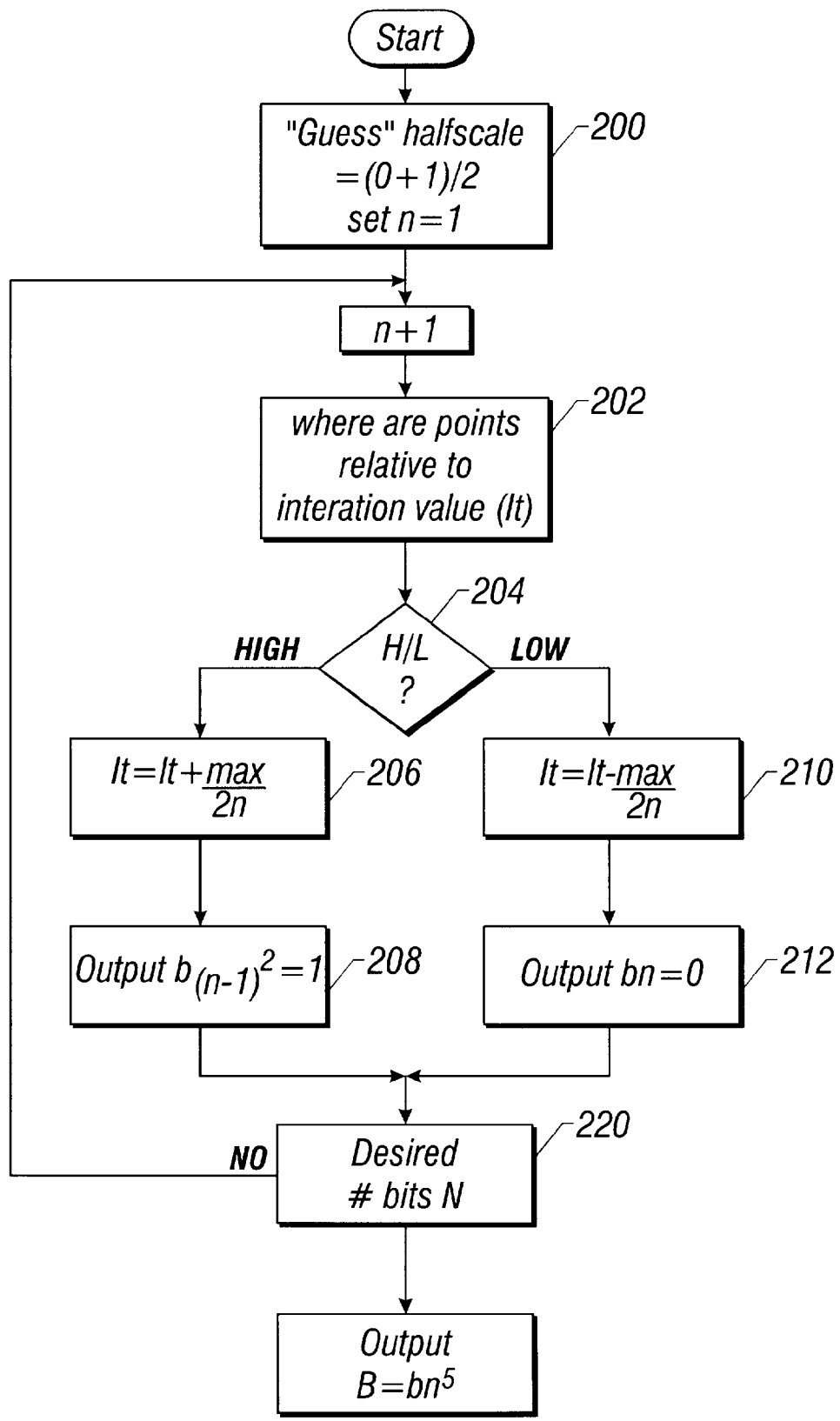
FIG. 2 shows how neighborhoods in a pixel system would be reconstructed.

The operation is conceptually described with reference to FIGS. 1A–1F and the flowchart of FIG. 2. This example assumes five different analog voltage levels for which a median digital value is desired. The voltage levels are shown on the FIGS. 1A–1F as five voltages 100, 102, 104, 106, and 108. For simplicity, these voltages are normalized to a scale of 0 to 1 (e.g., 0 volts to 1 volt). Each voltage is indicated by X marks on a horizontal scale. The desired "real" output of the median filter process is shown by the inverted triangle 112 near the scale at the top of FIGS. 1A–1F.

The process starts at step 200 by "guessing" half scale (min+max)/2=0.5 where min is the lowest (zero scale) value and max is the full scale value. Step 202 represents determining the relationship between voltages 102–110 relative to iteration no. 1, shown as element 115. Two points lie below iteration no. 1 and three above, hence there are more points above than below. The decision block 204 hence branches to "high". The second iteration is therefore increased by max/$2^n$ at step 206, where n is the iteration number, here n=1. The second iteration is thus 0.5+0.25=0.75, shown by the arrow 120 in Figure B. Bit $b_n$ represents the output of the decision for iteration n. The output of "1" for the bit $b_1$ indicates that the majority of bits lie above the first iteration value.

Flow returns to step 201, which increments the iteration and step 202 which again investigates the values as described above. The majority of points lie below this guess point in FIG. 1B, so step 204 passes control to step 210 which decreases the next iteration by max/$2^n$, here to 0.5+0.25−0.125=0.625. The new iteration is shown by the arrow 125 on FIG. 1C. Step 212 outputs $b_n$=0. Now the majority of the points lie above this fourth iteration value, so the iteration is increased by max/$2^{(n-4)}$=0.0625 at step 206 to 0.6875, as shown by the arrow 130 in FIG. 1D. The successive approximation continues until N iterations are detected at step 220, where N is the number of bits of resolution that are desired. The digital word b is the digital representation of the median analog value.

As described above, the median filtering algorithm determines the next iteration decision using the majority value. This differs from successive approximation techniques that use an absolute voltage input, not a majority input, to make the decision on the next iteration.

Figure 3:
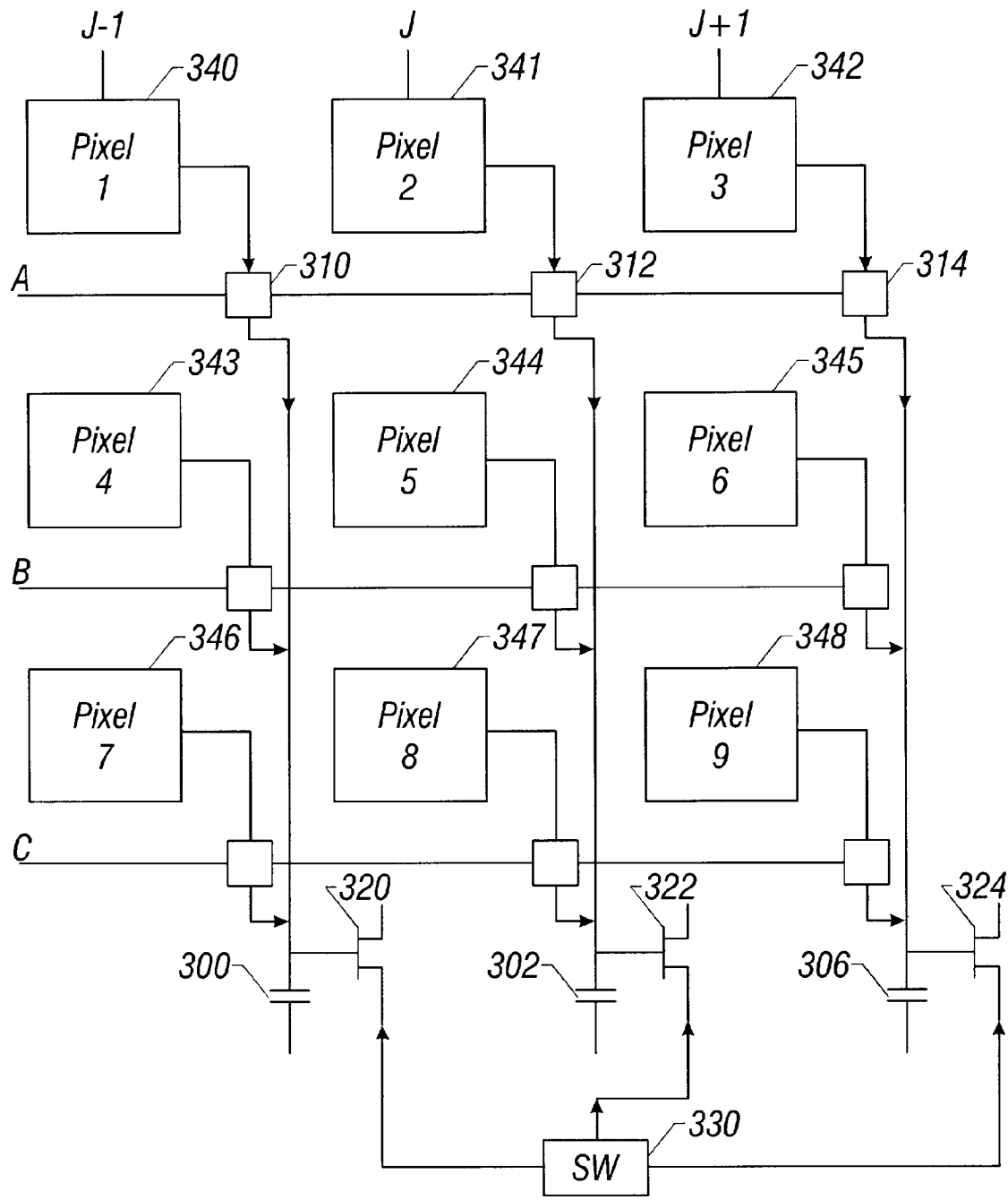
FIG. 3 shows a successive approximation A/D converter which is modified to determine median value.

FIG. 3 shows an image sensor that incorporates the special digital successive approximation technique. First, the neighborhood must be selected. This embodiment investigates a 3×3 kernel of information which requires investigating the values of nine pixels. Those nine pixels are selected and stored in either separate memories or memory locations 340–348, respectively. The memories are labelled in FIG. 3 as pixels 1–9, respectively. The pixels are arranged into rows and columns, and one sampling capacitor 300, 302 and 304 is located at the bottom of each column.

Each pixel is associated with a sample and hold switch, such as 310 and 312. The sample and hold switches in each of the columns J−1, J, J+1 are addressed in unison.

For example, bringing line A active enables all of the sample and hold switches 310, 312 and 314. This simultaneously transfers the values from pixels 1, 2 and 3 on the respective capacitors 300, 302 and 304. These values are respectively buffered by source followers 320, 322 and 324. A processing circuit, including a rotary switch, allows sampling the values from these source followers in a round-robin fashion. Essentially, rotary switch first samples the value from source follower 320, then 322, then 324, returning again to 320. At that time, the control on row A is brought inactive, and row B is brought active to provide the values from pixels 4, 5 and 6 on this pass.

Figure 4:
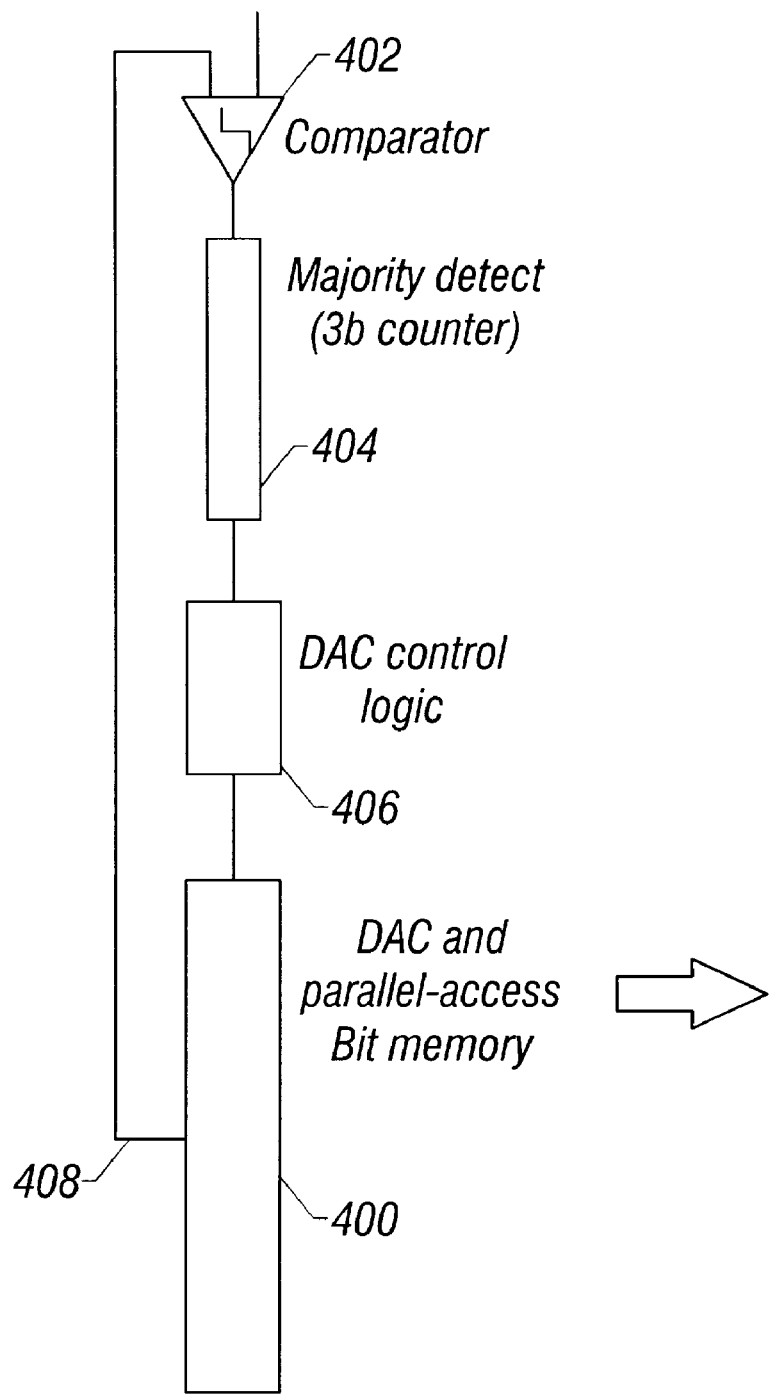
FIG. 4 shows a modified successive approximation A/D converter block diagram for carrying out median processing.

The modified successive approximation A/D converter circuitry block diagram is shown in FIG. 4 for a 3×3 kernel (9 pixel local neighborhood). The digital to analog ("D/A") converter has an output that tracks the latest approximation. Each time the D/A converter 400 output 401 changes to a new approximation, a round-robin comparison of the neighborhood is performed as described above using the switched values and comparator 402. Counter 404 maintains a count of the condition of those pixel values. The D/A converter is then updated to a new approximation by control logic 406 based on the results of the comparisons.

To determine if a majority of pixels in the neighborhood are above a given threshold, each pixel of the neighborhood is selected in turn by switches A, B, C and rotary switches 330, 312, 314 and 316. Comparator 402 compares a current value against the current approximation 402 that is being output from DAC 400. If the pixel value is greater than the approximation, the 3 bit majority-detect counter 404 is incremented. The bits of that counter represent whether median has been exceeded. For a 3×3 window, once the first two bit positions of the 3 bit counter overflow, into the third bit, the majority-detect is logically true. The counter is hence disabled from counting further based on the third bit. Other window sizes or detections can easily be accomodated by appropriate selection of the active counter bits.

Once all 9 pixels have been compared, the next approximation is computed by DAC control logic 406. If majority-detect is false, the current bit n of the binary word B is set to zero. The majority-detect counter is then reset, and the next bit n+1 of the binary word is set to one. The new D/A converter value is output as 401 for comparison to the neighborhood pixels.

Thus, to compute 10 bit resolution requires 9×10=90 comparator strobes.

A preferred aspect uses a programmable majority-detect signal which selects desired bits of the counter output value. This can be done by using logic gates to take desired combinations of the counter output bits. This allows the kernel for the median filter to be dynamically varied, 3×3, 3×1, 1×3, 2×2, etc. An odd number of pixels makes the most sense for a median operation. For even numbers, the system needs to arbitrate ties as either high or low, by selection of numbers.

This programmable operation allows selection of a single pixel neighborhood to revert to normal, i.e., non-median filtering function operation of the image sensor.

The D/A converter can be implemented in several ways. In normal linear fashion, the D/A converter produces a voltage that is proportional to a reference value, Vref, and a digital word D, such that D represents a fraction from 0 to 1. Thus the output is D*Vref, where 0<D<1. A low power DAC can be implemented using binary weighted, switched capacitors and a unity-gain amplifier, such as a source follower or op amp. A source-follower typically adds a threshold voltage drop, which is an offset relative to the desired output.

Figure 4A:
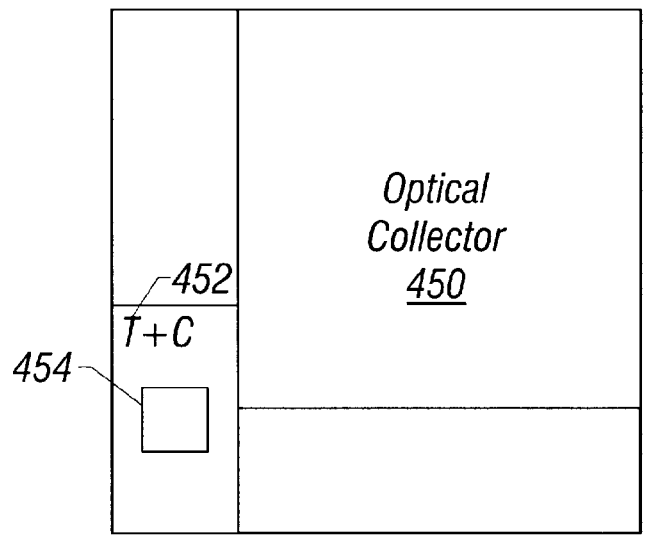
FIG. 4A shows an optical array with an on-board median filter of the present invention.

The preferred embodiment is used in the environment of an optical array as shown in FIG. 4A. The optical collector area 450 is formed of a number of pixel areas. Each pixel area receives optical energy for an area of the optical scene being imaged.

A pixel neighborhood to be median processed can be selected by the neighborhood selector 454 within the timing and control unit 452. Those pixels are stored into appropriate register locations and processed as described above. Since the median filter is on chip, this facilitates replacement of any bad pixels on the chip by the processed median. A second embodiment embellishes on the above. In some image sensor applications, it is desirable to relate the output of the image sensor to the square root of the input signal. Such square-rooting keeps constant the noise level in the lower significant bits, for example. "Square rooting" also accentuates weak signals, and tempers washout by bright signals. The square rooting function can be considered as a specific case of the generic gamma correction, $Y = X^{1/gamma}$ where gamma has a value of 2.

Figure 5:
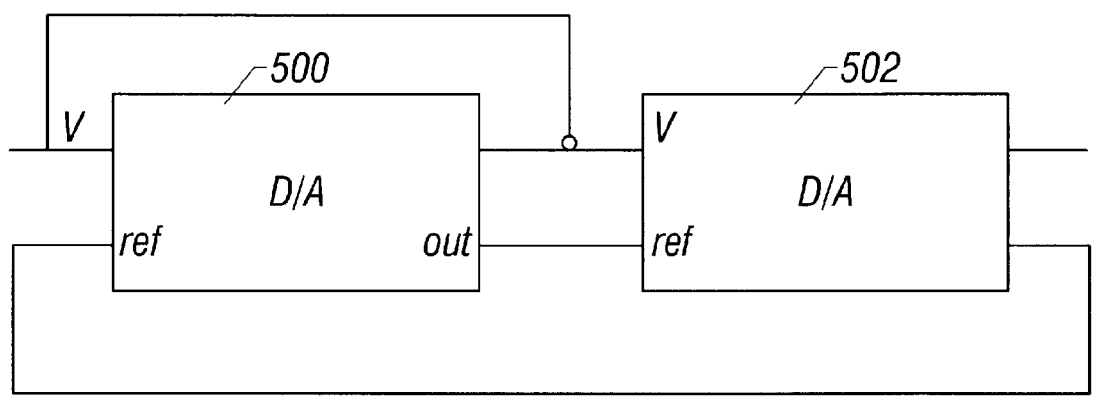
FIG. 5 shows a weighted median filter.

This embodiment implements the square rooting function by cascading two D/A converters 500 and 502 in series with the same digital input value as shown in FIG. 5. The reference input for the second D/A converter 502 is provided by the output of the first D/A converter 500. The output of the first D/A converter is D*Vref, and the output of the cascaded D/A converter is used in the feedback to the successive approximation. Therefore, the successive approximation computes the value of D such that $D^2 Vref$ equals the median pixel analog value. Thus, $$D \propto \sqrt{\text{median analog value}}$$

The cascade function need not be implemented by two separate D/A converters. The output of the D/A converter could alternately be fed back to itself via a sample and hold buffer to re-use the same D/A converter for the above-described cascade effect. The second D/A converter can also be either short circuited or its input set to all "1"s in order to return to the normal linear function.

Although only a few embodiments have been described in detail above, those having ordinary skill in the art will certainly understand that many modifications are possible in the preferred embodiment without departing from the teachings thereof.

For example, although pure median has been discussed, it should be apparent that this system can be used for determination of weighted median, e.g., the pixel whose value has ⅓ of the pixels greater, and ⅔ less great.

Weighting other than by square roots can also be done using the disclosed techniques.

All such modifications are intended to be encompassed within the following claims.

What is claimed is:

1. A digital pixel value detection circuit comprising:
   a pixel selector, selecting a plurality of pixel values for processing;
   a resolution selecting element, which selects a desired resolution for said processing; and
   a digital detector element, responsive to said pixel selector, and operating to output portions of information one by one, said portions collectively indicating a digital value which has a first predetermined portion of pixels in said neighborhood that are greater than said digital value, and a second predetermined portion of pixels in said neighborhood that are less great than said digital value, and successively outputting said portions, to a resolution that is based on said desired resolution.

2. A circuit as in claim 1, wherein said digital value is weighted by a predetermined weighting factor.

3. A image processing system, comprising:
   a pixel selector, selecting a plurality of pixel values for processing;
   a successive approximation A/D converter, comparing said pixel values to a reference, and changing said reference based on said comparing, said reference being an iteration indicating a processed pixel value which has a first predetermined portion of pixels in said neighborhood that are greater than said digital value, and a second predetermined portion of pixels in said neighborhood that are less great than said digital value;
   a counter element, which counts a weighted relationship among said pixels to produce an indication to make said reference better represent said processed pixel value.

4. A circuit as in claim 1, further comprising a chip substrate, an optical image sensor, integrated on said substrate and producing signals indicative of incoming optical radiation in units of pixel values, wherein said pixel selector, said resolution selecting element, and said digital detector element are all integrated on said substrate, and said pixel selector selects certain of said pixel values as said neighborhood.

5. An optical semiconductor, comprising:
   an optical substrate;
   an optical collector, integrated in said substrate, and producing pixel value information indicating optical energy in each of a plurality of different pixels;
   an optical processor, also integrated in said substrate, and including:
   a pixel selector, selecting a plurality of said pixel values for processing;
   a successive approximation A/D converter, comparing said pixel values to a reference, and changing said reference based on said comparing, said reference being an iteration indicating a processed pixel value which has a first predetermined portion of pixel values in said plurality of pixel values that are greater than said reference, and a second predetermined portion of pixels in said plurality of pixel values that are less great than said reference; and
   a counter element, which counts a weighted relationship among said pixel values to produce an indication to make said reference better represent said processed pixel value.

6. A digital median detector comprising:
   a semiconductor substrate;
   an array of optical pixels, on said substrate, each producing an output indicating an amount of incoming radiation;
   a neighborhood selector, on said substrate, selecting a neighborhood of pixel values to be median processed; and
   a digital median detector element, on said substrate, responsive to said neighborhood selector, and operating to output a digital value indicating a median among the neighborhood of selected pixel values from the array on the substrate.

7. A detector as in claim 6, wherein said digital median detector element includes a successive approximation A/D converter circuit, also on said substrate, which compares a current median with a threshold, and outputs bits of the median detected value.

8. A detector as in claim 6, wherein said digital median detector element includes a counter, and an element that determines values for bits by counting a number of times that said pixel value is in a specified relationship with other pixel values.

9. A detector as in claim 6, further comprising a neighborhood size adjusting element, which enables a size of the neighborhood to be selected.

10. A digital median detector comprising:
    a neighborhood selector, selecting a neighborhood of pixel values to be median processed;
    a plurality of sample and hold elements, a number of said sample and hold element being less than a total number of pixels in said neighborhood;
    a switching circuit, progressively switching to connect said sample and hold circuits to said neighborhood of pixel values at different times; and
    a digital median detector element, receiving values from said switching circuits, and operating to output a digital value indicating a median among the neighborhood of pixel values.

11. A method of digitally median-detecting a group of pixels, comprising:
    obtaining a successive approximation A/D converter and a counter; and
    using said A/D converter with said counter to count a majority weighting, such that bits are sequentially produced indicative of a value of the group of pixels which has a predetermined percentage of bits higher than the value and a predetermined percentage of bits lower than the value, and
    feeding back an output within the A/D converter, to effect a weighting operation.

12. A digital median detector comprising:
    a chip substrate;
    an optically sensitive area on said chip substrate, said optically sensitive area including a plurality of pixel areas;
    a neighborhood selector, on said chip substrate, operating to select a neighborhood of pixel values from said optically sensitive area to be median filtered;
    a subneighborhood selector, selecting a number of pixel values from said neighborhood and determining some information from said number of pixel values, said number being less than all of the pixel values in said neighborhood; and
    a digital median detector element, on said chip substrate, responsive to said neighborhood selector and said subneighborhood selector, and operating to output a digital value indicating a median among the selected pixel values.

13. A detector as in claim 12, wherein said digital median detector element includes a weighting element, and outputs a weighted digital information indicating said digital value one bit at a time.

14. A method of digitally detecting a weighted processed pixel value comprising:

using a first part of a chip substrate to detect optical energy in units of pixels;

selecting, on said chip substrate, a neighborhood of pixel values from said first part of the chip to be processed; and processing said pixel values in said neighborhood to output a processed pixel value which has a first predetermined portion of pixels in said neighborhood that are greater than said processed pixel value and a second predetermined portion of pixels in said neighborhood that are less great than said digital value weighted by a square root function, wherein said weighting is carried out as part of said processing and said processed pixel value is produced one bit at a time.

* * * * *